(12) United States Patent
Zhang et al.

(10) Patent No.: US 10,181,484 B2
(45) Date of Patent: Jan. 15, 2019

(54) TFT SUBSTRATE MANUFACTURING METHOD AND TFT SUBSTRATE

(71) Applicant: Wuhan China Star Optoelectronics Technology Co., Ltd., Wuhan (CN)

(72) Inventors: Haijie Zhang, Wuhan (CN); Zhandong Zhang, Wuhan (CN); Ling Yang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 10 days.

(21) Appl. No.: 15/544,023

(22) PCT Filed: May 16, 2017

(86) PCT No.: PCT/CN2017/084601
§ 371 (c)(1),
(2) Date: Jul. 17, 2017

(87) PCT Pub. No.: WO2018/184279
PCT Pub. Date: Oct. 11, 2018

(65) Prior Publication Data
US 2018/0294293 A1  Oct. 11, 2018

(30) Foreign Application Priority Data
Apr. 5, 2017  (CN) .......................... 2017 1 0218699

(51) Int. Cl.
*H01L 27/14*  (2006.01)
*H01L 29/04*  (2006.01)
(Continued)

(52) U.S. Cl.
CPC ........ *H01L 27/1296* (2013.01); *H01L 27/124* (2013.01); *H01L 27/127* (2013.01)

(58) Field of Classification Search
None
See application file for complete search history.

(56) References Cited

U.S. PATENT DOCUMENTS

| 7,064,021 B2 | 6/2006 | Chang |
| 2016/0149161 A1* | 5/2016 | Lee ..................... H01L 51/5271 257/40 |
| 2016/0300866 A1* | 10/2016 | Long ....................... H01L 21/77 |

FOREIGN PATENT DOCUMENTS

| CN | 104637874 A | 5/2015 |
| CN | 105895581 A | 8/2016 |

(Continued)

*Primary Examiner* — Calvin Y Choi
(74) *Attorney, Agent, or Firm* — Leong C. Lei

(57) ABSTRACT

The invention provides a TFT substrate manufacturing method and TFT substrate. The TFT substrate manufacturing method first etches the gate insulation layer to form two first through-holes and forming two bridging metal blocks inside the two first through holes; then etches the interlayer dielectric layer to form two second through-holes connecting respectively the two first through-holes, the source and drain connecting the two bridging metal blocks respectively through the two second through-holes. By changing a conventional etching process into two etching process to form the through-hole structure on the gate insulation layer and interlayer dielectric layer, able to improve uniformity of the active layer, reduce process difficulty, avoid the problem of etching stopped due to higher etching thickness, and improve the product quality.

12 Claims, 9 Drawing Sheets

(51) Int. Cl.
*H01L 29/15* (2006.01)
*H01L 31/036* (2006.01)
*H01L 27/12* (2006.01)

(56) References Cited

FOREIGN PATENT DOCUMENTS

| | | | |
|---|---|---|---|
| JP | 4275346 | B2 | 6/2009 |
| JP | 2010272691 | A | 12/2010 |

\* cited by examiner

| providing a base substrate, and forming, in subsequent order of, a buffer layer and an active layer on the base substrate; performing ion doping at two ends of the active layer to form two ion heavily doped areas; forming a gate insulation layer on the active layer and the buffer layer; | — S1 |

↓

| forming a photo-resist layer on the gate insulation layer, forming a first groove and two first vias on the photo-resist layer; | — S2 |

↓

| using the remaining photo-resist layer as shielding to perform etching on the gate insulation layer to form two first through-holes at locations corresponding respectively to below the two first vias; | — S3 |

↓

| performing an overall thinning process on the photo-resist layer to transform the first groove into a second via; performing ion doping on the active layer to form a channel; | — S4 |

↓

| forming a gate on the gate insulation layer, and two bridging metal blocks located respectively in the two first through-holes; | — S5 |

↓

| using the gate as shielding to perform ion doping on the active layer to obtain two ion lightly doped areas located respectively between the channel and the two ion heavily doped areas; | — S6 |

↓

| forming an interlayer dielectric layer on the gate insulation layer, forming two second through-holes respectively above the two bridging metal blocks; | — S7 |

↓

| forming a source and a drain distributed with a gap on the interlayer dielectric layer, the source and the drain contacting the two bridging metal blocks through the two through-holes; | — S8 |

↓

| forming on the interlayer dielectric layer, in subsequent order of, a planarization layer, a common voltage, a passivation layer, and a pixel electrode, stacked from bottom up. | — S9 |

Fig. 4

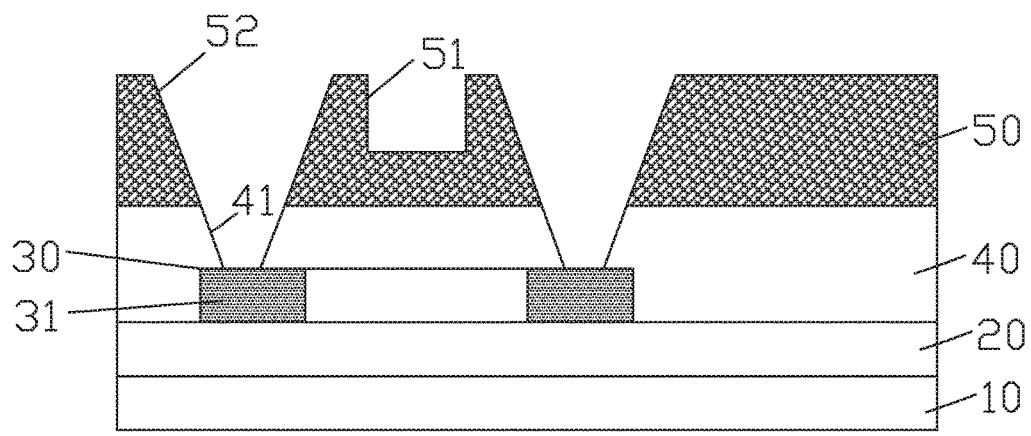
Fig. 7
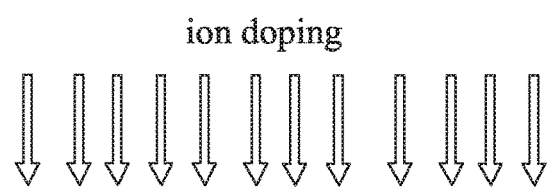
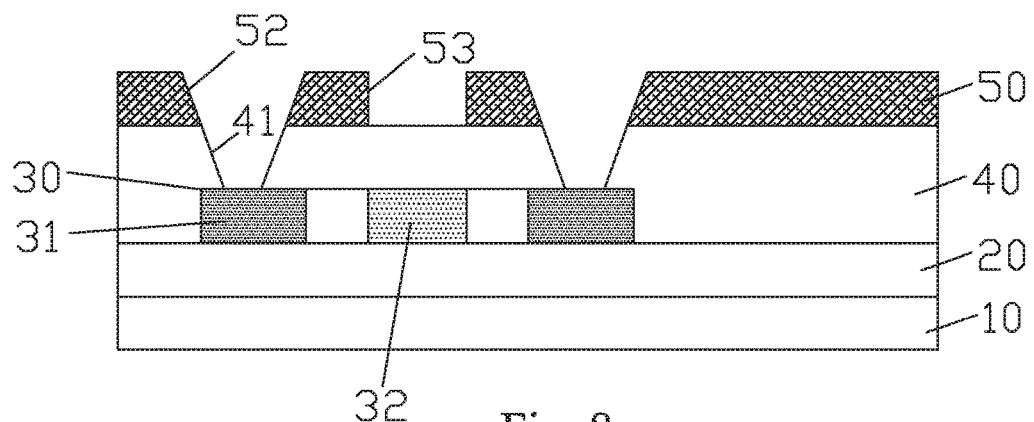
Fig. 8

TFT SUBSTRATE MANUFACTURING METHOD AND TFT SUBSTRATE

BACKGROUND OF THE INVENTION

1. Field of the Invention

The present invention relates to the field of display, and in particular to a thin film transistor (TFT) substrate manufacturing method and TFT substrate.

2. The Related Arts

As display technology progresses, the liquid crystal display (LCD) shows the advantages of high display quality, low power-consumption, thinness, and wide applications, the LCD is widely used in various devices, such as, liquid crystal TV, mobile phones, PDA, digital camera, PC monitors or notebook PC screens, becomes the leading display technology.

The LCDs in current market are mostly backlit type LCDs, which comprises a LCD panel and a backlight module. The operation principle of the LCD panel is to disposed liquid crystal (LC) molecules between the two parallel glass substrates, which are disposed with a plurality of tiny wires vertically and horizontally in-between. By supplying electricity through the wires or not to control the LC molecules to change direction, the LC molecules can deflect the light from the backlight module to generate an image.

The LCD panel usually comprises a color filter (CF) substrate, a thin film transistor (TFT) substrate, a liquid crystal (LC) sandwiched between the CF substrate and the TFT substrate, and a sealant; wherein the TFT substrate is the main driving component in the LCD panel and is directly related to the development direction of high performance LCD.

As shown in FIGS. 1-3, the known TFT substrate manufacturing method comprises the following steps:

Step 1: as shown in FIG. 1, providing a base substrate 100, and forming, in subsequent order of, a buffer layer 200, an active layer 300, a gate insulation layer 400, a gate 500, and an interlayer dielectric layer 600;

Step 2: as shown in FIG. 2, performing etching simultaneously on the interlayer dielectric layer 600 and the gate insulation layer 400 to form vias on the interlayer dielectric layer 600 and the gate insulation layer 400 respectively corresponding to two ends of the active layer 300;

Step 3: as shown in FIG. 3, forming on the interlayer dielectric layer 600, in subsequent order of, a source 700 and a drain 800, a planarization layer 900, a common electrode 1000, a passivation layer 1100, and a pixel electrode 1200.

In Step 2 of the above TFT substrate manufacturing method, the process of performing simultaneous etching on the interlayer dielectric layer 600 and the gate insulation layer 400 is difficult to control because the interlayer dielectric layer 600 and the gate insulation layer 400 have a total thickness, which easily leads to non-penetrating vias or over-etching vias damaging the active layer 300, resulting in product defects. Therefore, it is imperative to devise an improve TFT substrate manufacturing method to address the above issue.

SUMMARY OF THE INVENTION

The object of the present invention is to provide a TFT substrate manufacturing method, able to improve the active layer uniformity, reduce process difficulty, avoid the problem of etching stopped due to higher etching thickness, and improve the product quality.

Another object of the present invention is to provide a TFT substrate, able to improve the active layer uniformity, reduce process difficulty, avoid the problem of etching stopped due to higher etching thickness, and improve the product quality.

To achieve the above object, the present invention provides a thin film transistor (TFT) substrate manufacturing method, comprising:

Step 1: providing a base substrate, and forming, in subsequent order of, a buffer layer and an active layer on the base substrate; performing ion doping at two ends of the active layer to form two ion heavily doped areas; forming a gate insulation layer on the active layer and the buffer layer;

Step 2: forming a photo-resist layer on the gate insulation layer, performing etching and exposure with a half tone mask on the photo-resist layer to form a first groove and two first vias on the photo-resist layer; the first groove being located above a channel area to be formed between the two ion heavily doped areas, and the two first vias being located respectively above the two ion heavily doped areas;

Step 3: using the remaining photo-resist layer as shielding to perform etching on the gate insulation layer to form two first through-holes at locations corresponding respectively to below the two first vias;

Step 4: performing an overall thinning process on the photo-resist layer to transform the first groove into a second via;

using the remaining photo-resist layer as shielding to perform ion doping on the active layer to form a channel at locations below the second via;

Step 5: peeling the remaining photo-resist layer, depositing a first metal layer on the gate insulation layer, performing patternizing on the first metal layer to obtain a gate corresponding to a location above the channel, and two bridging metal blocks located respectively inside the two first through-holes;

Step 6: using the gate as shielding to perform ion doping on the active layer to obtain two ion lightly doped areas located respectively between the channel and the two ion heavily doped areas;

Step 7: forming an interlayer dielectric layer on the gate insulation layer, performing etching on the interlayer dielectric layer to form two second through-holes respectively above the two bridging metal blocks;

Step 8: depositing a second metal layer on the interlayer dielectric layer, performing patternizing on the second metal layer to obtain a source and a drain distributed with a gap on the interlayer dielectric layer, the source and the drain contacting the two bridging metal blocks through the two through-holes;

Step 9: forming on the interlayer dielectric layer, in subsequent order of, a planarization layer, a common voltage, a passivation layer, and a pixel electrode, stacked from bottom up.

According to a preferred embodiment of the present invention, the etching on the gate insulation layer in Step 3 and the etching on the interlayer dielectric layer in Step 7 are both dry etching.

According to a preferred embodiment of the present invention, in Step 4, the overall thinning processing on the photo-resist layer is a photo-resist ashing method.

According to a preferred embodiment of the present invention, the pixel electrode contacts the drain through a third through-hole penetrating the planarization layer and the passivation layer.

According to a preferred embodiment of the present invention, the base substrate is a glass substrate; the buffer layer, gate insulation layer, interlayer dielectric layer, and passivation layer are all made of a combination of one or more of silicon nitride ($SiN_x$) and silicon oxide ($SiO_x$); the active layer is made of polysilicon; the gate and the bridging metal blocks are made of at least one or alloy of molybdenum (Mo), aluminum (Al), copper (Cu), titanium (Ti), and tungsten (W); the planarization layer is made of a transparent organic insulation material; and the common electrode and the pixel electrode are made of indium tin oxide (ITO).

The present invention also provides a thin film transistor (TFT) substrate, comprising: a base substrate, a buffer layer covering the base substrate, an active layer disposed on the buffer layer, a gate insulation layer covering the active layer and the buffer layer, two first through-holes penetrating the gate insulation layer, two bridging metal blocks respectively inside the two first through-holes, a gate disposed on the gate insulation layer, an interlayer dielectric layer covering the gate and the gate insulation layer, two second through-holes penetrating the interlayer dielectric layer, a source and a drain distributed with a gap disposed on the interlayer dielectric layer, and a planarization layer, a common electrode, a passivation layer, and a pixel electrode, stacked from the bottom up, disposed on the source, drain and the interlayer dielectric layer;

the active layer comprising: a channel, two ion heavily doped areas located respectively at two sides of the channel, and two ion lightly doped areas located respectively between the channel and the two ion heavily doped areas;

the two first through-holes being located respectively above the two ion heavily doped areas, the two bridging metal blocks contacting respectively the two ion heavily doped areas, and the gate being located on the gate insulation layer above the channel;

the two second through-holes connected respective the two first through-holes, and the source and the drain contacting the two bridging metal blocks through the two second through-holes respectively.

According to a preferred embodiment of the present invention, the pixel electrode contacts the drain through a third through-hole penetrating the planarization layer and the passivation layer.

According to a preferred embodiment of the present invention, the first through-holes are obtained by separately performing dry etching on the gate insulation layer; the second through-holes are obtained by separately performing dry etching on the interlayer dielectric layer.

According to a preferred embodiment of the present invention, the base substrate is a glass substrate; the buffer layer, gate insulation layer, interlayer dielectric layer, and passivation layer are all made of a combination of one or more of silicon nitride($SiN_x$) and silicon oxide ($SiO_x$); the active layer is made of polysilicon; the gate and the bridging metal blocks are made of at least one or alloy of molybdenum (Mo), aluminum (Al), copper (Cu), titanium (Ti), and tungsten (W); the planarization layer is made of a transparent organic insulation material; and the common electrode and the pixel electrode are made of indium tin oxide (ITO).

The present invention further provides a thin film transistor (TFT) substrate manufacturing method, comprising:

Step 1: providing a base substrate, and forming, in subsequent order of, a buffer layer and an active layer on the base substrate; performing ion doping at two ends of the active layer to form two ion heavily doped areas; forming a gate insulation layer on the active layer and the buffer layer;

Step 2: forming a photo-resist layer on the gate insulation layer, performing etching and exposure with a half tone mask on the photo-resist layer to form a first groove and two first vias on the photo-resist layer; the first groove being located above a channel area to be formed between the two ion heavily doped areas, and the two first vias being located respectively above the two ion heavily doped areas;

Step 3: using the remaining photo-resist layer as shielding to perform etching on the gate insulation layer to form two first through-holes at locations corresponding respectively to below the two first vias;

Step 4: performing an overall thinning process on the photo-resist layer to transform the first groove into a second via;

using the remaining photo-resist layer as shielding to perform ion doping on the active layer to form a channel at locations below the second via;

Step 5: peeling the remaining photo-resist layer, depositing a first metal layer on the gate insulation layer, performing patternizing on the first metal layer to obtain a gate corresponding to a location above the channel, and two bridging metal blocks located respectively inside the two first through-holes;

Step 6: using the gate as shielding to perform ion doping on the active layer to obtain two ion lightly doped areas located respectively between the channel and the two ion heavily doped areas;

Step 7: forming an interlayer dielectric layer on the gate insulation layer, performing etching on the interlayer dielectric layer to form two second through-holes respectively above the two bridging metal blocks;

Step 8: depositing a second metal layer on the interlayer dielectric layer, performing patternizing on the second metal layer to obtain a source and a drain distributed with a gap on the interlayer dielectric layer, the source and the drain contacting the two bridging metal blocks through the two through-holes;

Step 9: forming on the interlayer dielectric layer, in subsequent order of, a planarization layer, a common voltage, a passivation layer, and a pixel electrode, stacked from bottom up;

wherein the etching on the gate insulation layer in Step 3 and the etching on the interlayer dielectric layer in Step 7 being both dry etching;

wherein in Step 4, the overall thinning processing on the photo-resist layer being a photo-resist ashing method.

Compared to the known techniques, the present invention provides the following advantages: the present invention provides a TFT substrate manufacturing method, first etching the gate insulation layer to form two first through-holes and forming two bridging metal blocks in the two first through-holes, then etching the interlayer dielectric layer to form two second through-holes connecting the two first through-holes respectively, the source and drain contacting two bridging metal blocks through two second through-holes respectively. By changing an etching process in conventional process into two etching processes separately on the gate insulation layer and interlayer dielectric layer to improve the uniformity of the active layer, reduce the process difficulty, avoid the problem of etching stopped due to higher etching thickness, and improve the product quality. The present invention also provides a TFT substrate, able to improve the uniformity of the active layer, reduce the process difficulty, avoid the problem of etching stopped due to higher etching thickness, and improve the product quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings:

FIG. 4 is schematic view showing the flowchart of the TFT substrate manufacturing method according to the present invention;

FIG. 7 is schematic view showing Step 3 of the TFT substrate manufacturing method according to the present invention;

FIG. 8 is schematic view showing Step 4 of the TFT substrate manufacturing method according to the present invention;

DETAILED DESCRIPTION OF THE PREFERRED EMBODIMENTS

To further explain the technical means and effect of the present invention, the following refers to embodiments and drawings for detailed description.

Figure 1:
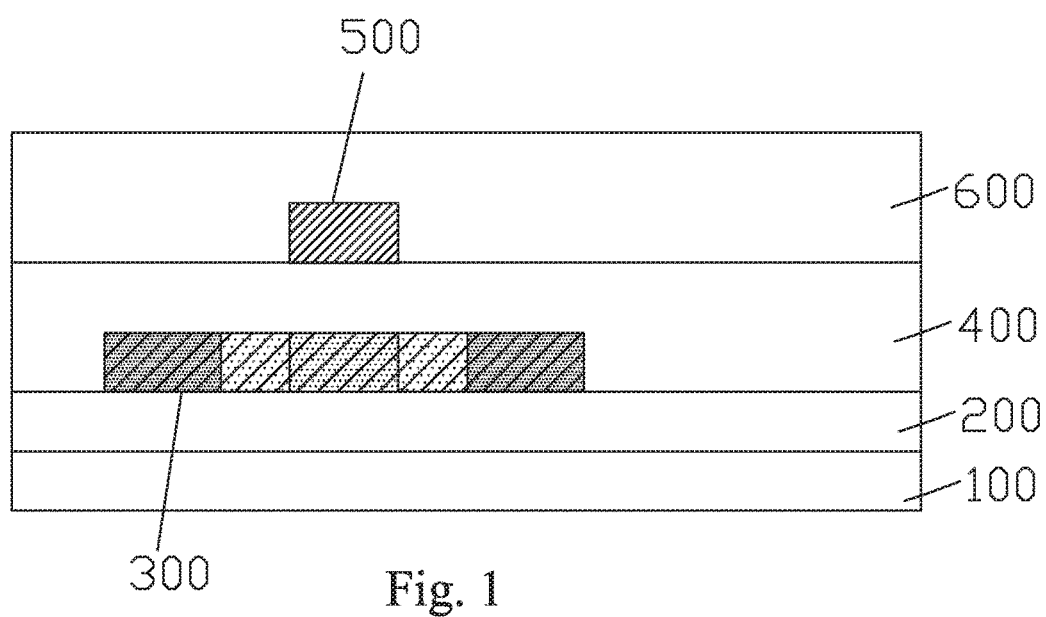
FIG. 1 is a schematic view showing Step 1 of a known TFT substrate manufacturing method.
Figure 2:
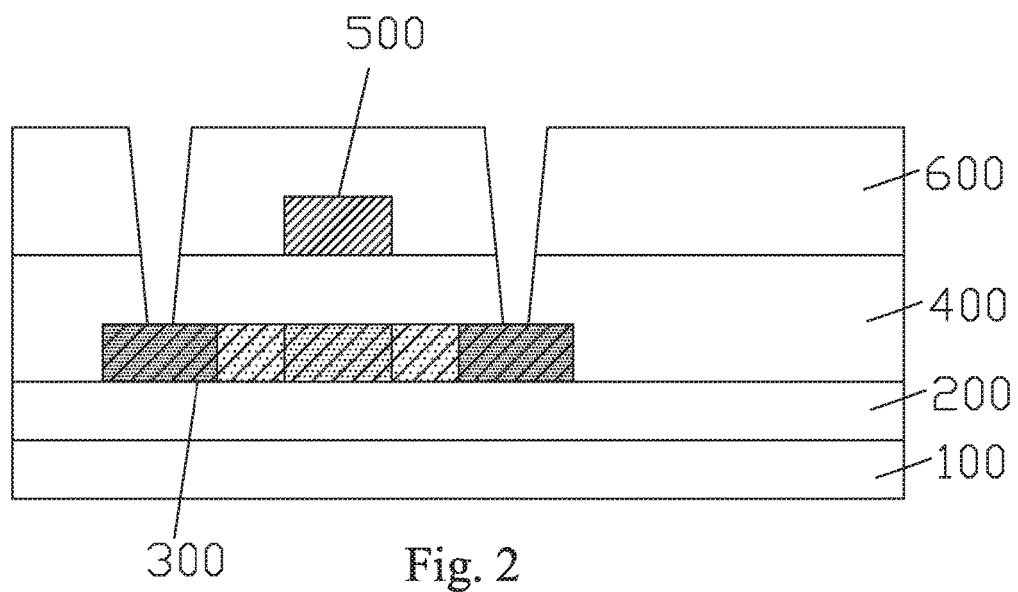
FIG. 2 is a schematic view showing Step 2 of a known TFT substrate manufacturing method.
Figure 3:
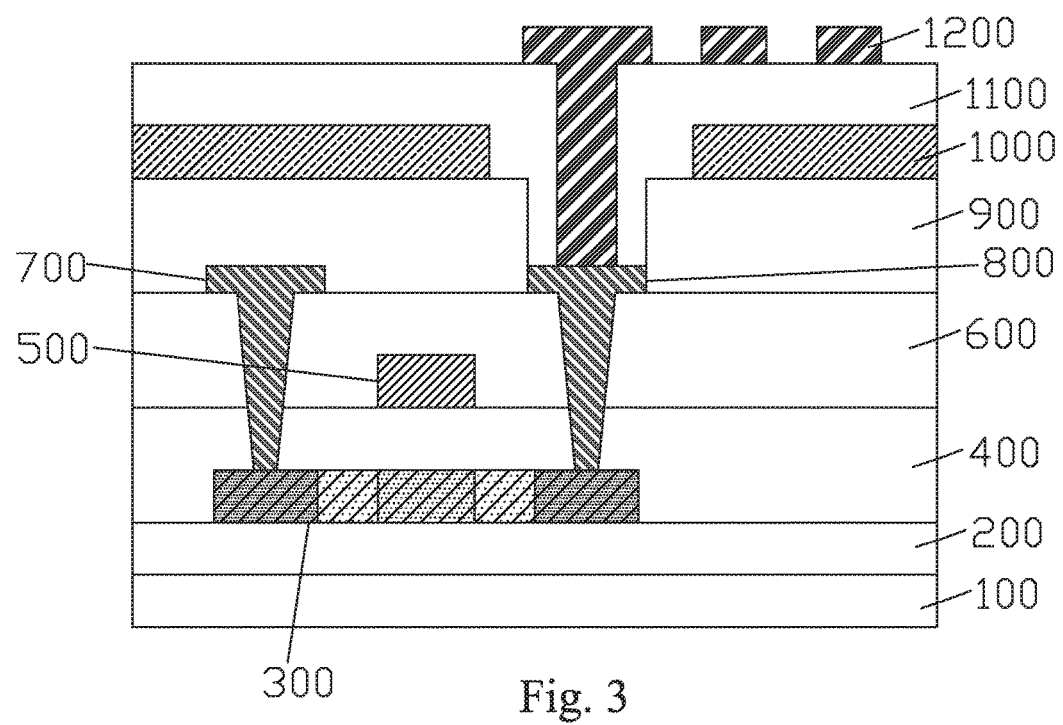
FIG. 3 is a schematic view showing Step 3 of a known TFT substrate manufacturing method.
Figure 5:
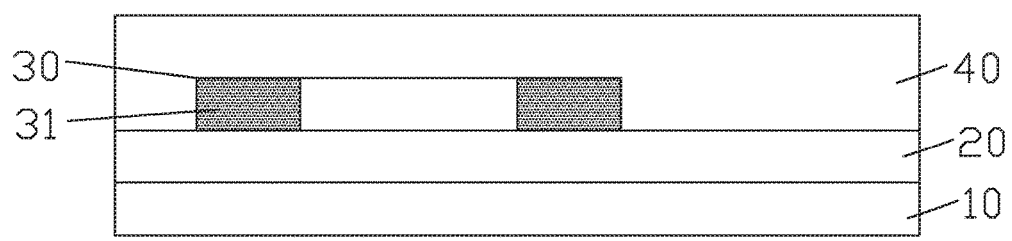
FIG. 5 is schematic view showing Step 1 of the TFT substrate manufacturing method according to the present invention.

Refer to FIG. 4, the present invention provides a thin film transistor (TFT) substrate manufacturing method, comprising:

Step 1: as shown in FIG. 5, providing a base substrate 10, and forming, in subsequent order of, a buffer layer 20 and an active layer 30 on the base substrate 10;

performing ion doping at two ends of the active layer 30 to form two ion heavily doped areas 31;

forming a gate insulation layer 40 on the active layer 30 and the buffer layer 20.

Specifically, the base substrate 10 is a glass substrate.

Specifically, the buffer layer 20 is made of a combination of one or more of silicon nitride ($SiN_x$) and silicon oxide ($SiO_x$).

Specifically, the active layer 30 is made of polysilicon.

Specifically, in Step 1, a mask is used to perform ion doping on the two ends of the active layer 30.

Figure 6:
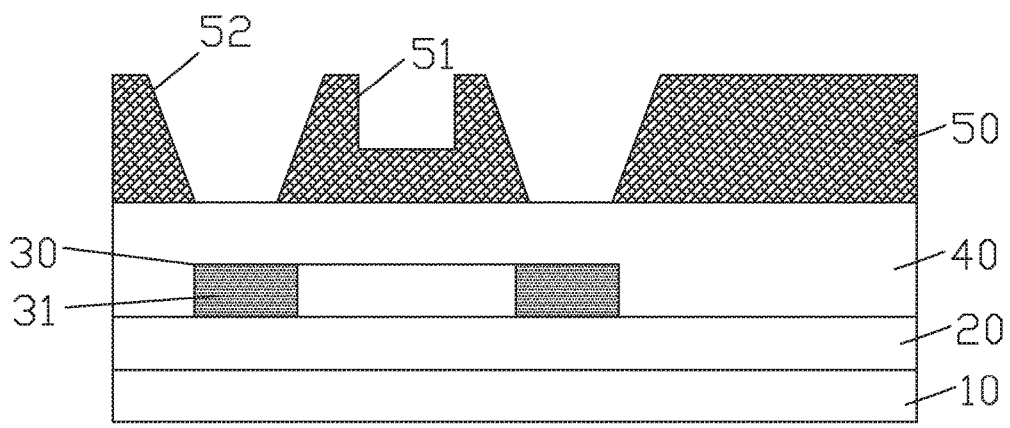
FIG. 6 is schematic view showing Step 2 of the TFT substrate manufacturing method according to the present invention.

Step 2: as shown in FIG. 6, forming a photo-resist layer 50 on the gate insulation layer 40, performing etching and exposure with a half tone mask on the photo-resist layer 50 to form a first groove 51 and two first vias 52 on the photo-resist layer 50; the first groove 51 being located above a channel area to be formed between the two ion heavily doped areas 31, and the two first vias 52 being located respectively above the two ion heavily doped areas 31;

Specifically, the gate insulation layer 40 is made of a combination of one or more of silicon nitride ($SiN_x$) and silicon oxide ($SiO_x$).

Step 3: as shown in FIG. 7, using the remaining photo-resist layer 50 as shielding to perform etching on the gate insulation layer 40 to form two first through-holes 41 at locations corresponding respectively to below the two first vias 41.

Specifically, the etching on the gate insulation layer 40 is dry etching.

Specifically, because the gate insulation layer is relatively thinner, the etching process is easier to control to achieve uniformity and not prone to non-penetrating vias or over-etching vias causing the inconsistent loss to the active layer 30; thus, improving product quality.

Step 4: as shown in FIG. 8, performing an overall thinning process on the photo-resist layer 50 to transform the first groove 51 into a second via 53;

using the remaining photo-resist layer 50 as shielding to perform ion doping on the active layer 30 to form a channel 32 at locations below the second via 53.

Specifically, in Step 4, the overall thinning processing on the photo-resist layer 50 is a photo-resist ashing method.

Figure 9:
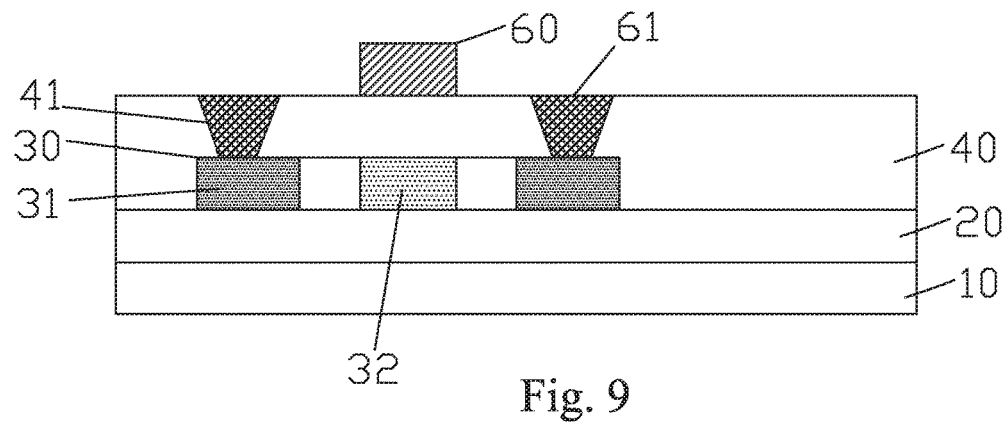
FIG. 9 is schematic view showing Step 5 of the TFT substrate manufacturing method according to the present invention.

Step 5: as shown in FIG. 9, peeling the remaining photo-resist layer 50, depositing a first metal layer on the gate insulation layer 40, performing patternizing on the first metal layer to obtain a gate 60 corresponding to the location above the channel 32, and two bridging metal blocks 61 located respectively inside the two first through-holes 41.

Specifically, the gate 60 and the bridging metal blocks 61 are made of at least one or alloy of molybdenum (Mo), aluminum (Al), copper (Cu), titanium (Ti), and tungsten (W).

Figure 10:
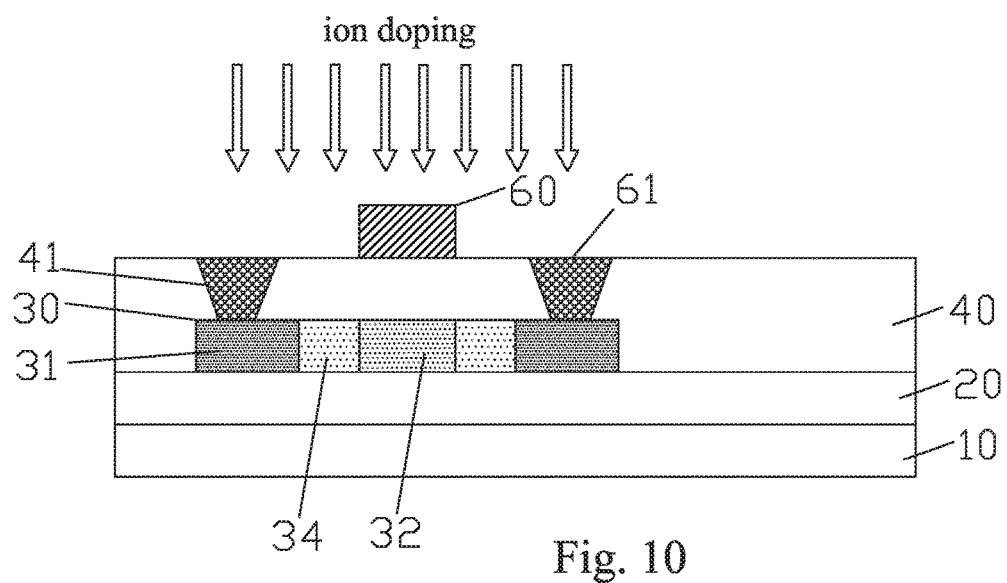
FIG. 10 is schematic view showing Step 6 of the TFT substrate manufacturing method according to the present invention.

Step 6: as shown in FIG. 10, without using a mask, using the gate 60 as shielding to perform ion doping on the active layer 30 to obtain two ion lightly doped areas 35 located respectively between the channel 32 and the two ion heavily doped areas 31.

Figure 11:
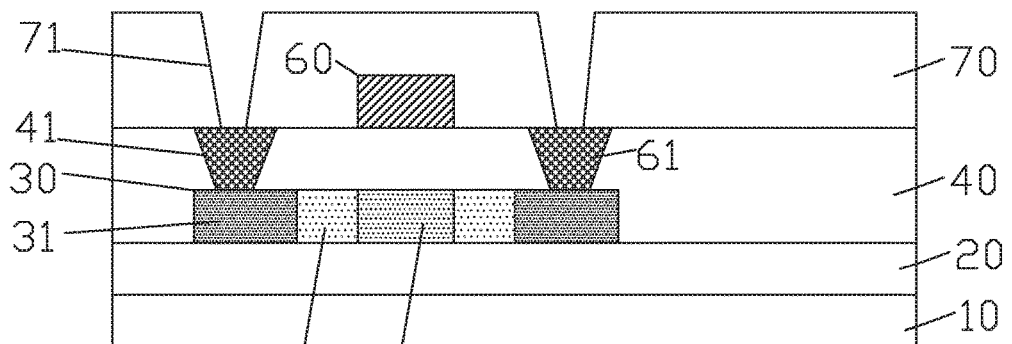
FIG. 11 is schematic view showing Step 7 of the TFT substrate manufacturing method according to the present invention.

Step 7: as shown in FIG. 11, forming an interlayer dielectric layer 70 on the gate insulation layer 40, performing etching on the interlayer dielectric layer 70 to form two second through-holes 71 respectively above the two bridging metal blocks 61.

Specifically, the etching on the interlayer dielectric layer in Step 7 is dry etching.

Specifically, because the bottom layer of the second through-holes 71 is the bridging metal blocks 61, it is not necessary to concern about the loss of the active layer 30 when etching, and the process window is large, which can effectively reduce the process difficulty, avoid the problem of etching stopped due to higher etching thickness, and improve the product quality.

Specifically, the interlayer dielectric layer 70 is made of a combination of one or more of silicon nitride ($SiN_x$) and silicon oxide ($SiO_x$).

Figure 12:
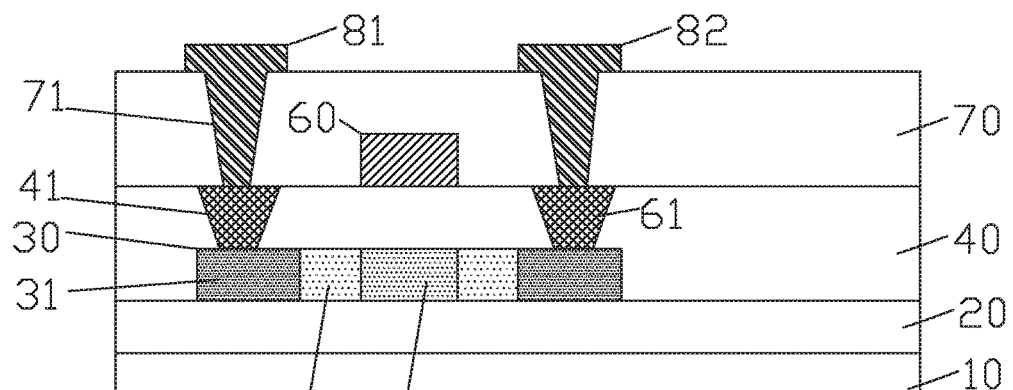
FIG. 12 is schematic view showing Step 8 of the TFT substrate manufacturing method according to the present invention.

Step 8: as shown in FIG. 12, depositing a second metal layer on the interlayer dielectric layer 70, performing patternizing on the second metal layer to obtain a source 81 and a drain 82 distributed with a gap on the interlayer dielectric layer 70, the source 81 and the drain 82 contacting the two bridging metal blocks 61 through the two through-holes 71.

Figure 13:
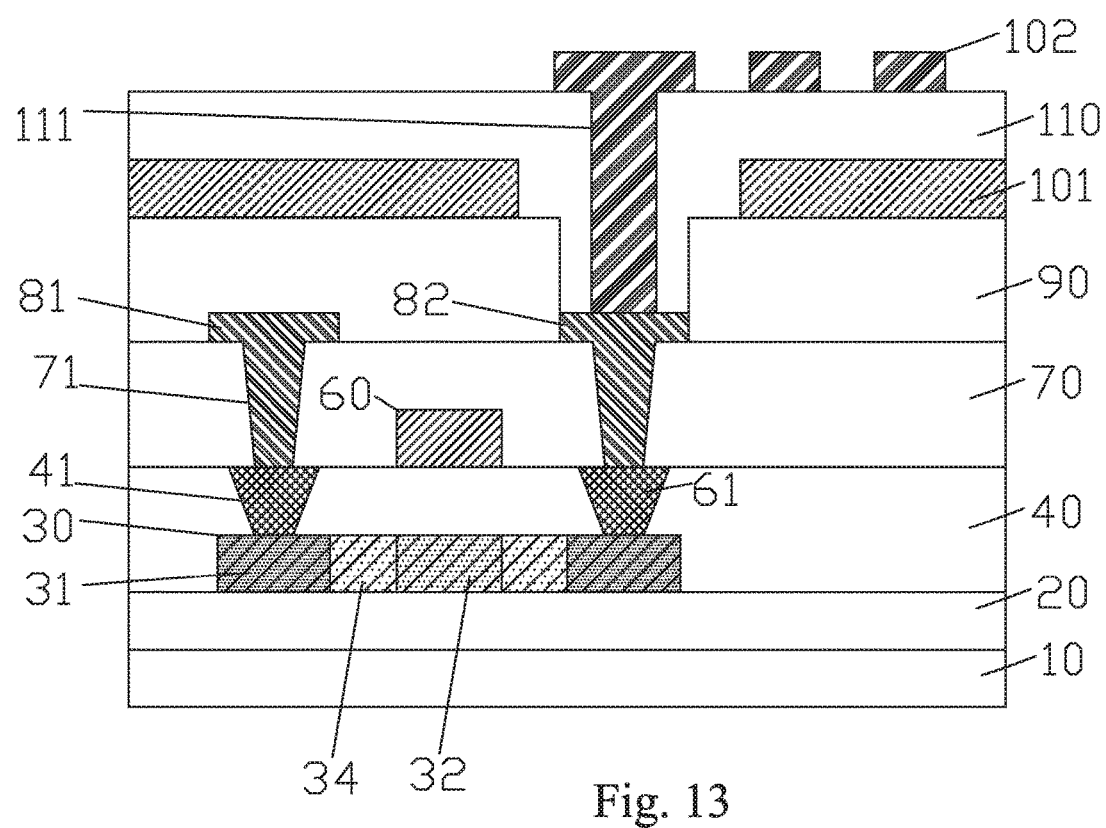
FIG. 13 is a schematic view showing Step 9 of the manufacturing method of TFT substrate, and the TFT substrate structure according to the present invention.

Step 9: as shown in FIG. 13, forming on the interlayer dielectric layer 70, in subsequent order of, a planarization layer 90, a common voltage 101, a passivation layer 110, and a pixel electrode 103, stacked from bottom up.

Specifically, in Step 9, a third through-hole 111 is formed on the passivation layer 110 and planarization layer 90 at a location above the drain 82, and the pixel electrode 102 contacts the drain 82 through the third through-hole 111.

Specifically, the planarization layer 90 is made of a transparent organic insulation material.

Specifically, the common electrode 101 and the pixel electrode 102 are made of indium tin oxide (ITO).

Specifically, the passivation layer 110 is made of a combination of one or more of silicon nitride ($SiN_x$) and silicon oxide ($SiO_x$).

The above TFT substrate manufacturing method changes an etching process in conventional process into two etching processes separately on the gate insulation layer 40 and interlayer dielectric layer 70; the first is to etch the gate insulation layer 40; because the gate insulation layer 40 is relatively thinner, the etching process is easier to control to achieve uniformity and not prone to non-penetrating vias or over-etching vias causing the inconsistent loss to the active layer 30; then to etch the interlayer dielectric layer 70, because the bottom layer of the second through-holes 71 is the bridging metal blocks 61, it is not necessary to concern about the loss of the active layer 30 when etching, and the process window is large, which can effectively reduce the process difficulty, avoid the problem of etching stopped due to higher etching thickness, and improve the product quality.

Refer to FIG. 13, based on the above TFT substrate manufacturing method, the present invention also provides a TFT substrate, comprising: a base substrate 10, a buffer layer 20 covering the base substrate 10, an active layer 30 disposed on the buffer layer 20, a gate insulation layer 40 covering the active layer 30 and the buffer layer 20, two first through-holes 41 penetrating the gate insulation layer 40, two bridging metal blocks 61 respectively inside the two first through-holes 41, a gate 60 disposed on the gate insulation layer 40, an interlayer dielectric layer 70 covering the gate 60 and the gate insulation layer 40, two second through-holes 71 penetrating the interlayer dielectric layer 70, a source 81 and a drain 82 distributed with a gap disposed on the interlayer dielectric layer 70, and a planarization layer 90, a common electrode 101, a passivation layer 110, and a pixel electrode 102, stacked from the bottom up, disposed on the source 81, drain 82 and the interlayer dielectric layer 70;

the active layer 30 comprising: a channel 32, two ion heavily doped areas 31 located respectively at two sides of the channel 32, and two ion lightly doped areas 34 located respectively between the channel 32 and the two ion heavily doped areas 31;

the two first through-holes 41 being located respectively above the two ion heavily doped areas 31, the two bridging metal blocks 61 contacting respectively the two ion heavily doped areas 31, and the gate 60 being located on the gate insulation layer 40 above the channel 40;

the two second through-holes 71 connected respective the two first through-holes 41, and the source 81 and the drain 82 contacting the two bridging metal 61 blocks through the two second through-holes 71 respectively.

Specifically, the first through-holes 41 are obtained by separately performing dry etching on the gate insulation layer 40.

Specifically, the second through-holes 71 are obtained by separately performing dry etching on the interlayer dielectric layer 70.

Specifically, the pixel electrode 102 contacts the drain 82 through a third through-hole 111 penetrating the planarization layer 90 and the passivation layer 110.

Specifically, the base substrate is a glass substrate.

Specifically, the buffer layer 20, gate insulation layer 40, interlayer dielectric layer 70, and passivation layer 110 are all made of a combination of one or more of silicon nitride ($SiN_x$) and silicon oxide ($SiO_x$).

Specifically, the active layer 30 is made of polysilicon.

Specifically, the gate 60 and the bridging metal blocks 61 are made of at least one or alloy of molybdenum (Mo), aluminum (Al), copper (Cu), titanium (Ti), and tungsten (W).

Specifically, the planarization layer 90 is made of a transparent organic insulation material.

Specifically, the common electrode 101 and the pixel electrode 102 are made of indium tin oxide (ITO).

The above TFT substrate changes the one through-hole structure in conventional gate insulation layer 40 and interlayer dielectric layer 70 into a two through-hole structure; the first is to etch the gate insulation layer 40; because the gate insulation layer 40 is relatively thinner, the etching process is easier to control to achieve uniformity and not prone to non-penetrating vias or over-etching vias causing the inconsistent loss to the active layer 30; then to etch the interlayer dielectric layer 70, because the bottom layer of the second through-holes 71 is the bridging metal blocks 61, which avoids the effect on the active layer 30 when etching, and the process window is large, which can effectively reduce the process difficulty, avoid the problem of etching stopped due to higher etching thickness, and improve the product quality.

In summary, the present invention provides a TFT substrate manufacturing method and TFT substrate; first etching the gate insulation layer to form two first through-holes and forming two bridging metal blocks inside the two first through holes; then etching the interlayer dielectric layer to form two second through-holes connecting respectively the two first through-holes, the source and drain connecting the two bridging metal blocks respectively through the two second through-holes. By changing a conventional etching process into two etching process to form the through-hole structure on the gate insulation layer and interlayer dielectric layer, able to improve uniformity of the active layer, reduce process difficulty, avoid the problem of etching stopped due to higher etching thickness, and improve the product quality.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A thin film transistor (TFT) substrate manufacturing method, comprising the steps of:

Step 1: providing a base substrate, and forming, in subsequent order of, a buffer layer and an active layer on the base substrate; performing ion doping at two ends of the active layer to form two ion heavily doped areas; forming a gate insulation layer on the active layer and the buffer layer;

Step 2: forming a photo-resist layer on the gate insulation layer, performing etching and exposure with a half tone mask on the photo-resist layer to form a first groove and two first vias on the photo-resist layer; the first groove being located above a channel area to be formed between the two ion heavily doped areas, and the two first vias being located respectively above the two ion heavily doped areas;

Step 3: using the remaining photo-resist layer as shielding to perform etching on the gate insulation layer to form two first through-holes at locations corresponding respectively to below the two first vias;

Step 4: performing an overall thinning process on the photo-resist layer to transform the first groove into a second via;

using the remaining photo-resist layer as shielding to perform ion doping on the active layer to form a channel at locations below the second via;

Step 5: peeling the remaining photo-resist layer, depositing a first metal layer on the gate insulation layer, performing patternizing on the first metal layer to obtain a gate corresponding to a location above the channel, and two bridging metal blocks located respectively inside the two first through-holes;

Step 6: using the gate as shielding to perform ion doping on the active layer to obtain two ion lightly doped areas located respectively between the channel and the two ion heavily doped areas;

Step 7: forming an interlayer dielectric layer on the gate insulation layer, performing etching on the interlayer dielectric layer to form two second through-holes respectively above the two bridging metal blocks;

Step 8: depositing a second metal layer on the interlayer dielectric layer, performing patternizing on the second metal layer to obtain a source and a drain distributed with a gap on the interlayer dielectric layer, the source and the drain contacting the two bridging metal blocks through the two through-holes;

Step 9: forming on the interlayer dielectric layer, in subsequent order of, a planarization layer, a common voltage, a passivation layer, and a pixel electrode, stacked from bottom up.

2. The TFT substrate manufacturing method as claimed in claim 1, wherein the etching on the gate insulation layer in Step 3 and the etching on the interlayer dielectric layer in Step 7 are both dry etching.

3. The TFT substrate manufacturing method as claimed in claim 1, wherein in Step 4, the overall thinning processing on the photo-resist layer is a photo-resist ashing method.

4. The TFT substrate manufacturing method as claimed in claim 1, wherein the pixel electrode contacts the drain through a third through-hole penetrating the planarization layer and the passivation layer.

5. The TFT substrate manufacturing method as claimed in claim 1, wherein the base substrate is a glass substrate; the buffer layer, gate insulation layer, interlayer dielectric layer, and passivation layer are all made of a combination of one or more of silicon nitride ($SiN_x$) and silicon oxide ($SiO_x$); the active layer is made of polysilicon; the gate and the bridging metal blocks are made of at least one or alloy of molybdenum (Mo), aluminum (Al), copper (Cu), titanium (Ti), and tungsten (W); the planarization layer is made of a transparent organic insulation material; and the common electrode and the pixel electrode are made of indium tin oxide (ITO).

6. A thin film transistor (TFT) substrate, comprising: a base substrate, a buffer layer covering the base substrate, an active layer disposed on the buffer layer, a gate insulation layer covering the active layer and the buffer layer, two first through-holes penetrating the gate insulation layer, two bridging metal blocks respectively inside the two first through-holes, a gate disposed on the gate insulation layer, an interlayer dielectric layer covering the gate and the gate insulation layer, two second through-holes penetrating the interlayer dielectric layer, a source and a drain distributed with a gap disposed on the interlayer dielectric layer, and a planarization layer, a common electrode, a passivation layer, and a pixel electrode, stacked from the bottom up, disposed on the source, drain and the interlayer dielectric layer;

the active layer comprising: a channel, two ion heavily doped areas located respectively at two sides of the channel, and two ion lightly doped areas located respectively between the channel and the two ion heavily doped areas;

the two first through-holes being located respectively above the two ion heavily doped areas, the two bridging metal blocks contacting respectively the two ion heavily doped areas, and the gate being located on the gate insulation layer above the channel;

the two second through-holes connected respective the two first through-holes, and the source and the drain contacting the two bridging metal blocks through the two second through-holes respectively.

7. The TFT substrate as claimed in claim 6, wherein, the pixel electrode contacts the drain through a third through-hole penetrating the planarization layer and the passivation layer.

8. The TFT substrate as claimed in claim 6, wherein the first through-holes are obtained by separately performing dry etching on the gate insulation layer; the second through-holes are obtained by separately performing dry etching on the interlayer dielectric layer.

9. The TFT substrate as claimed in claim 6, wherein the base substrate is a glass substrate; the buffer layer, gate insulation layer, interlayer dielectric layer, and passivation layer are all made of a combination of one or more of silicon nitride ($SiN_x$) and silicon oxide ($SiO_x$); the active layer is made of polysilicon; the gate and the bridging metal blocks are made of at least one or alloy of molybdenum (Mo), aluminum (Al), copper (Cu), titanium (Ti), and tungsten (W); the planarization layer is made of a transparent organic insulation material; and the common electrode and the pixel electrode are made of indium tin oxide (ITO).

10. A thin film transistor (TFT) substrate manufacturing method, comprising the steps of:

Step 1: providing a base substrate, and forming, in subsequent order of, a buffer layer and an active layer on the base substrate; performing ion doping at two ends of the active layer to form two ion heavily doped areas; forming a gate insulation layer on the active layer and the buffer layer;

Step 2: forming a photo-resist layer on the gate insulation layer, performing etching and exposure with a half tone mask on the photo-resist layer to form a first groove and two first vias on the photo-resist layer; the first groove being located above a channel area to be formed between the two ion heavily doped areas, and the two first vias being located respectively above the two ion heavily doped areas;

Step 3: using the remaining photo-resist layer as shielding to perform etching on the gate insulation layer to form two first through-holes at locations corresponding respectively to below the two first vias;

Step 4: performing an overall thinning process on the photo-resist layer to transform the first groove into a second via;

using the remaining photo-resist layer as shielding to perform ion doping on the active layer to form a channel at locations below the second via;

Step 5: peeling the remaining photo-resist layer, depositing a first metal layer on the gate insulation layer, performing patternizing on the first metal layer to obtain a gate corresponding to a location above the channel, and two bridging metal blocks located respectively inside the two first through-holes;

Step 6: using the gate as shielding to perform ion doping on the active layer to obtain two ion lightly doped areas located respectively between the channel and the two ion heavily doped areas;

Step 7: forming an interlayer dielectric layer on the gate insulation layer, performing etching on the interlayer dielectric layer to form two second through-holes respectively above the two bridging metal blocks;

Step 8: depositing a second metal layer on the interlayer dielectric layer, performing patternizing on the second metal layer to obtain a source and a drain distributed with a gap on the interlayer dielectric layer, the source and the drain contacting the two bridging metal blocks through the two through-holes;

Step 9: forming on the interlayer dielectric layer, in subsequent order of, a planarization layer, a common voltage, a passivation layer, and a pixel electrode, stacked from bottom up;

wherein the etching on the gate insulation layer in Step 3 and the etching on the interlayer dielectric layer in Step 7 being both dry etching;

wherein in Step 4, the overall thinning processing on the photo-resist layer being a photo-resist ashing method.

11. The TFT substrate manufacturing method as claimed in claim 10, wherein the pixel electrode contacts the drain through a third through-hole penetrating the planarization layer and the passivation layer.

12. The TFT substrate manufacturing method as claimed in claim 10, wherein the base substrate is a glass substrate; the buffer layer, gate insulation layer, interlayer dielectric layer, and passivation layer are all made of a combination of one or more of silicon nitride ($SiN_x$) and silicon oxide ($SiO_x$); the active layer is made of polysilicon; the gate and the bridging metal blocks are made of at least one or alloy of molybdenum (Mo), aluminum (Al), copper (Cu), titanium (Ti), and tungsten (W); the planarization layer is made of a transparent organic insulation material; and the common electrode and the pixel electrode are made of indium tin oxide (ITO).

* * * * *